(12) United States Patent
Prabhu et al.

(10) Patent No.: US 8,871,109 B2
(45) Date of Patent: Oct. 28, 2014

(54) METHOD FOR PREPARING A DONOR SURFACE FOR REUSE

(75) Inventors: Gopal Prabhu, San Jose, CA (US); Kathy J. Jackson, Felton, CA (US); Orion Leland, Fremont, CA (US); Aditya Agarwal, Sunnyvale, CA (US)

(73) Assignee: GTAT Corporation, Merrimack, NH (US)

( * ) Notice: Subject to any disclaimer, the term of this patent is extended or adjusted under 35 U.S.C. 154(b) by 637 days.

(21) Appl. No.: 12/557,379

(22) Filed: Sep. 10, 2009

(65) Prior Publication Data

US 2010/0273329 A1 Oct. 28, 2010

Related U.S. Application Data

(60) Provisional application No. 61/173,584, filed on Apr. 28, 2009.

(51) Int. Cl.
  *C03C 15/00* (2006.01)
  *C03C 25/68* (2006.01)
  *H01L 21/302* (2006.01)
  *H01L 21/461* (2006.01)

(52) U.S. Cl.
  CPC ................................ *H04L 31/1896* (2013.01); *Y02E 10/50* (2013.01)
  USPC ............... 216/88; 216/87; 438/690; 438/691; 438/692

(58) Field of Classification Search
  USPC ................. 216/87, 88; 438/690–692
  See application file for complete search history.

(56) References Cited

U.S. PATENT DOCUMENTS

| 6,010,579 A | | 1/2000 | Henley et al. |
| 6,103,599 A | | 8/2000 | Henley et al. |
| 6,146,979 A | * | 11/2000 | Henley et al. ............ 438/458 |
| 6,153,014 A | * | 11/2000 | Song ............................ 134/2 |

(Continued)

FOREIGN PATENT DOCUMENTS

| EP | 2015354 A1 | 1/2009 |
| WO | WO 2008107029 A1 * | 9/2008 |

OTHER PUBLICATIONS

Sun, Wangping, Grinding of Silicon Wafers: Wafer Shape Model and Its Applications, PhD Dissertation, Department of Industrial and Manufacturing Systems Engineering, College of Engineering, Kansas State University, 2005.

(Continued)

*Primary Examiner* — Allan Olsen
*Assistant Examiner* — Margaret D Klunk
(74) *Attorney, Agent, or Firm* — The Mueller Law Office, P.C.

(57) ABSTRACT

A donor wafer, for example of silicon, has an irregular surface following cleaving of a lamina from the surface, for example by exfoliation following implant of hydrogen and/or helium ions to define a cleave plane. Pinholes in the lamina leave column asperities at the exfoliated surface of the donor wafer, and the beveled edge may leave an edge asperity which fails to exfoliate. To prepare the surface of the donor wafer for reuse, mechanical grinding removes the column and edge asperities, and minimal additional thickness. Following cleaning, growth and removal of an oxide layer at the surface rounds remaining peaks. The smoothed surface is well adapted to bonding to a receiver element and exfoliation of a new lamina. A variety of devices may be fabricated from the lamina, for example a photovoltaic cell.

14 Claims, 9 Drawing Sheets

(56) References Cited

U.S. PATENT DOCUMENTS

| | | | |
|---|---|---|---|
| 6,159,825 | A | 12/2000 | Henley et al. |
| 6,335,264 | B1 | 1/2002 | Henley et al. |
| 7,531,428 | B2 | 5/2009 | Dupont |
| 2005/0164471 | A1* | 7/2005 | Maleville ............... 438/458 |
| 2006/0115986 | A1* | 6/2006 | Donohoe et al. ......... 438/690 |
| 2006/0118935 | A1* | 6/2006 | Kamiyama et al. ........ 257/684 |
| 2008/0124929 | A1* | 5/2008 | Okuda et al. ............ 438/692 |
| 2009/0194162 | A1 | 8/2009 | Sivaram et al. |
| 2010/0093152 | A1* | 4/2010 | Kerdiles et al. .......... 438/455 |

OTHER PUBLICATIONS

Young, H-T et al., "Precision wafer thinning and its surface conditioning technique," Int. J. Materials and Product Technology, vol. 31, No. 1, 2008, pp. 36-45.

Yang, Yu et al., "Process induced sub-surface damage in mechanically ground silicon wafers," Semicond. Sci. Technolo. 23 (2008), 075038, pp. 1-10.

Haapalinna, Atte et al., "Rotational grinding of silicon wafers—subsurface damage inspection," Materials Science and Engineering B107 (2004), pp. 321-331.

Chao, Choung-Li et al., "A Study on the Surface Integrity of Single Crystal Silicon Ground by CIFB—Diamond Wheels (ELID) and Resin-Bonded Diamond Wheels", Proceedings of Tamkang University, Tamsui, Taipei, Taiwan, 2005 International Nano and MEMS Workshop, Nov. 23-24, 2005, pp. 75-78.

Chidambaram, Somasundaram et al., "A Study of Grinding Marks in Semiconductor Wafer Grinding," American Society for Precision Engineering, Proceedings ASPE 2001 Annual Meeting.

GSI Westwind, Wafer Grinding, Air Bearings, tool specification.

* cited by examiner

Prior Art

Fig. 1

Embodiment of 12/026530

Fig. 2a

Embodiment of 12/026530

Fig. 2b

Embodiment of 12/026530

Fig. 2c

Embodiment of 12/026530

METHOD FOR PREPARING A DONOR SURFACE FOR REUSE

RELATED APPLICATIONS

This application claims priority from Gopal et al., U.S. Provisional Patent Application No. 61/173,584, "Methods For Removing Asperities From Silicon," filed Apr. 28, 2009, owned by the assignee of the present application and hereby incorporated by reference.

BACKGROUND OF THE INVENTION

The invention relates to a method to prepare a donor surface for reuse.

It is known to implant hydrogen and/or helium ions into a donor body such as a silicon wafer, defining a cleave plane, then to cleave a lamina from the donor body at the cleave plane. The donor body can be reused, providing additional laminae. There is typically a need to treat the surface of the donor body prior to reuse. If the donor lamina is to be used in the fabrication of devices requiring a very smooth surface, as do many semiconductor devices, the surface may be treated using chemical-mechanical polishing (CMP). For other uses which do not require such a smooth surface, however, CMP may prove too expensive.

There is a need, therefore, for an inexpensive and effective method to prepare the surface of a donor body for reuse.

SUMMARY OF THE PREFERRED EMBODIMENTS

The present invention is defined by the following claims, and nothing in this section should be taken as a limitation on those claims. In general, the invention is directed to a method to prepare the surface of a donor body for reuse.

A first aspect of the invention provides for a method for treating a surface of a silicon donor body, the method comprising the steps of providing the donor body, the surface of the donor body including silicon asperities having relief of at least two microns; mechanically grinding the surface to remove or reduce the asperities; after the grinding step, growing an oxide at the surface; etching to remove the oxide; and after the etching step, implanting ions through the surface to define a cleave plane within the donor body, wherein between the step of providing the donor body and the step of implanting ions, no more than about ten microns of thickness of silicon is removed from the donor body, including the relief of the asperities.

Another aspect of the invention provides for a method for treating a surface of a donor wafer, the method comprising the steps of: thermally cleaving a first lamina from the donor wafer, creating an exfoliated surface of the donor wafer; mechanically grinding the exfoliated surface to remove or reduce asperities; growing oxide on the exfoliated surface; etching to remove the oxide; implanting ions through the exfoliated surface to define a cleave plane within the donor wafer; and thermally cleaving a second lamina from the donor wafer at the cleave plane, wherein the second lamina is suitable for use in a photovoltaic cell.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
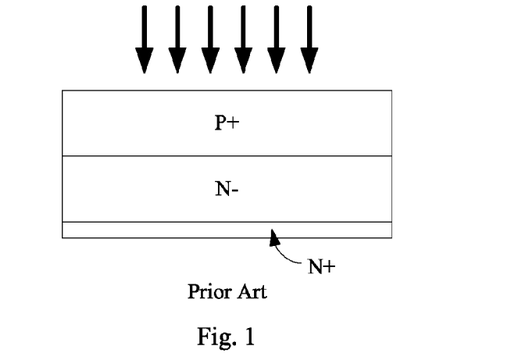
FIG. 1 is a cross-sectional drawing of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a n−/p+ junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
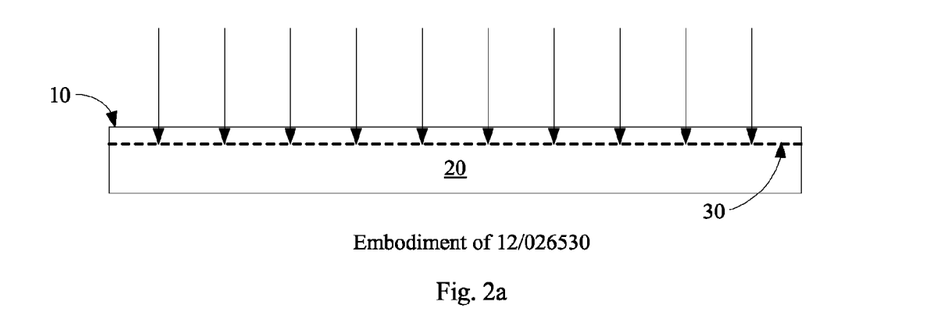
FIGS. 2a-2d are cross-sectional drawings of stages of fabrication of a photovoltaic cell formed according to an embodiment of U.S. patent application Ser. No. 12/026,530.
Figure 2B:
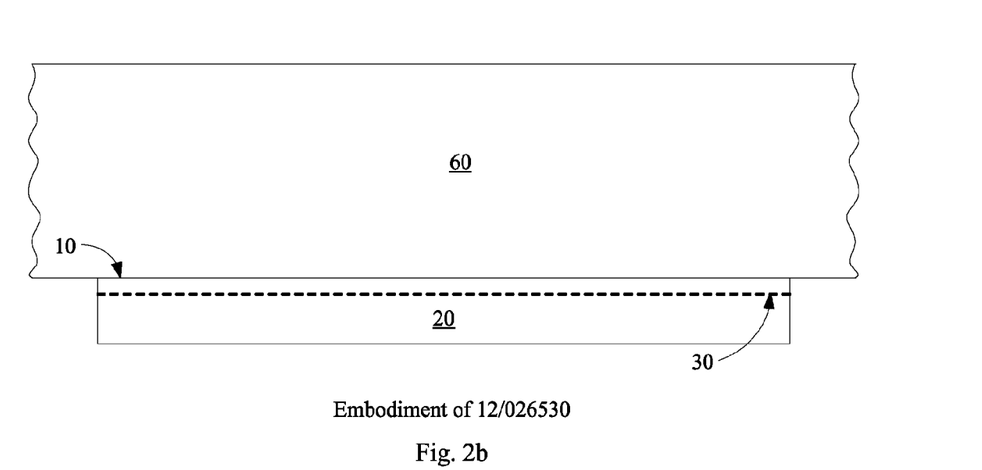
Figure 2C:
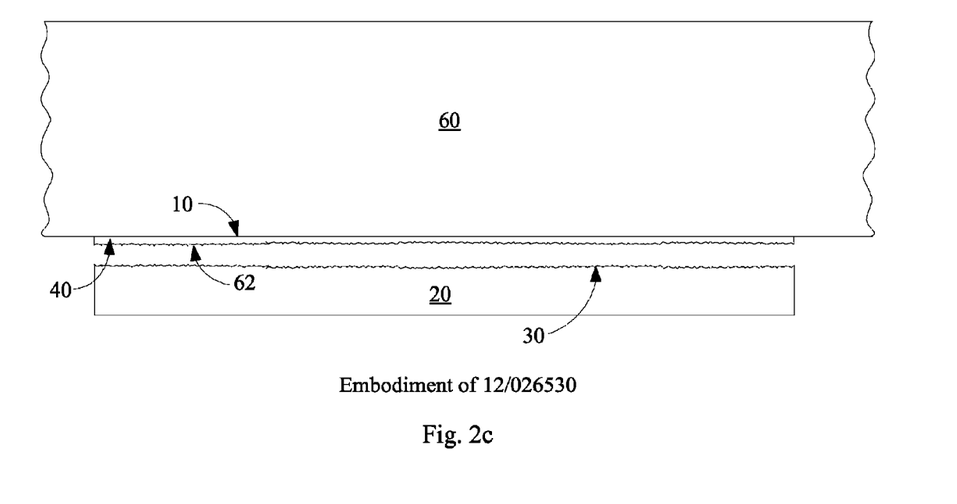
Figure 2D:
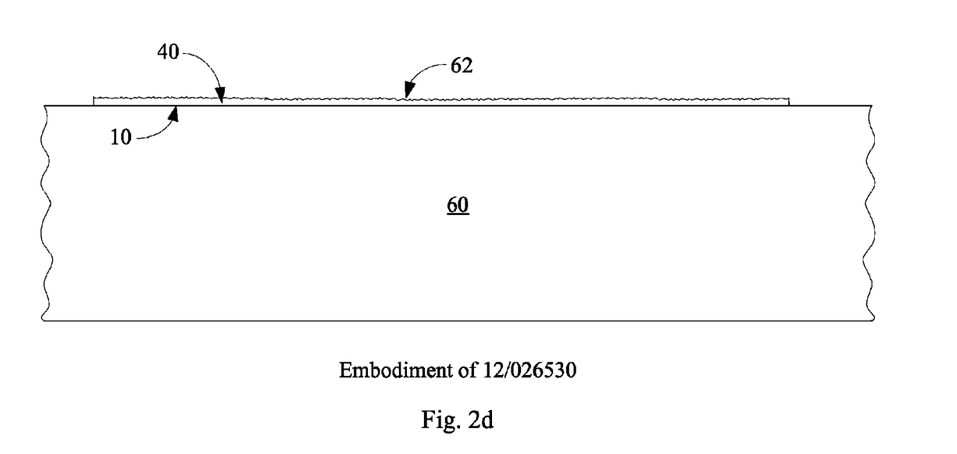

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Figure 3A:
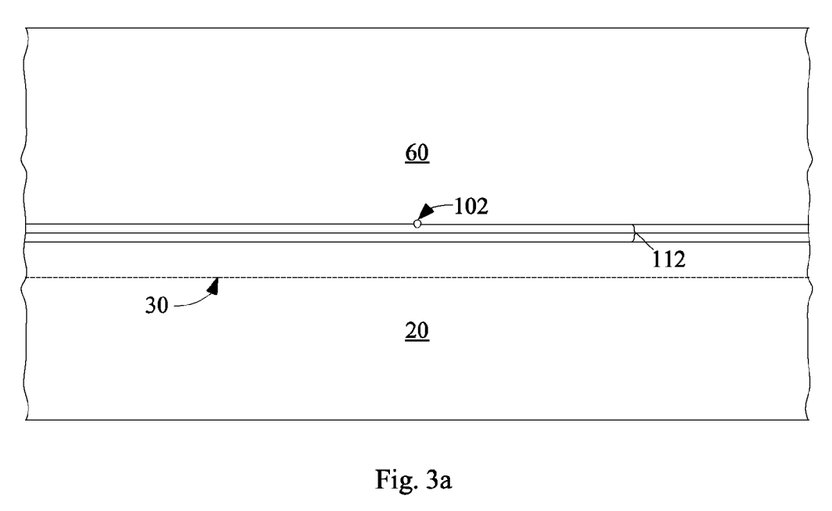
FIGS. 3a and 3b are cross-sectional views illustrating inadvertent fabrication of a pinhole in a lamina and a corresponding column asperity in a donor wafer.
Figure 3B:
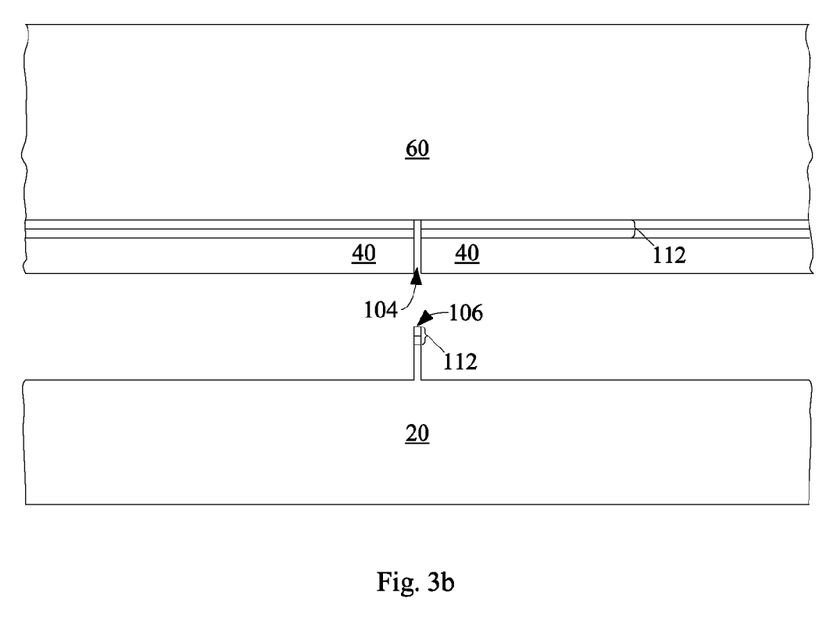

The original donor wafer may be 200, 300, or more microns thick, and thus multiple laminae may be cleaved from it. Following exfoliation, however, the new surface of the donor wafer 20 typically is not sufficiently planar for immediate reuse. There are several causes for such nonplanarity. Referring to FIGS. 3a and 3b, if bonding is imperfect in any location, for example if a particle 102 was present between the bonding surfaces of donor wafer 20 and receiver element 60, a pinhole 104 may form in lamina 40 during exfoliation at cleave plane 30. The material left behind remains on the donor wafer as a column asperity 106. The column asperity 106, in the shape of a pillar, usually has a height equal to the thickness of lamina 40, and also typically includes any layers formed on first surface 10 before bonding. For example, the layers of stack 112 will remain at the top of column asperity 106. These and other figures are not to scale.

Figure 4A:
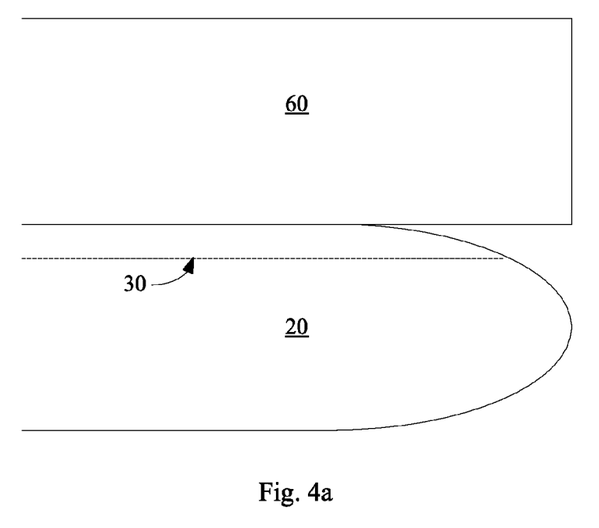
FIGS. 4a and 4b are cross-sectional views illustrating inadvertent fabrication of an edge asperity during cleaving of a lamina from a donor wafer.
Figure 4B:
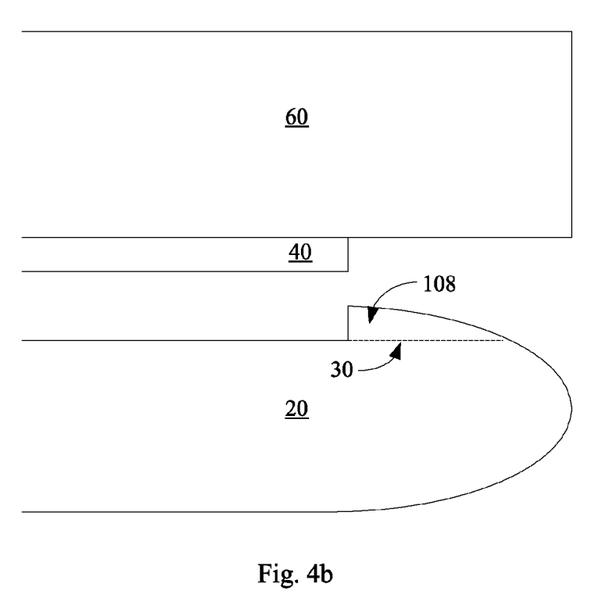

FIG. 4a shows the edge of donor wafer 20 and receiver element 60 when they are bonded, before cleaving. The edges of donor wafer 20 are typically beveled. The bevel distributes stress during routine handling and helps prevent breakage. As shown in FIG. 4b, exfoliation may occur successfully along cleave plane 30 only where the surfaces of donor wafer 20 (including any deposited layers on this surface, not shown) and receiver element 60 are bonded. An edge asperity 108 of material that failed to cleave at cleave plane 30 may remain where the beveled edge of donor wafer 20 did not meet the surface of receiver element 60.

Figure 5A:
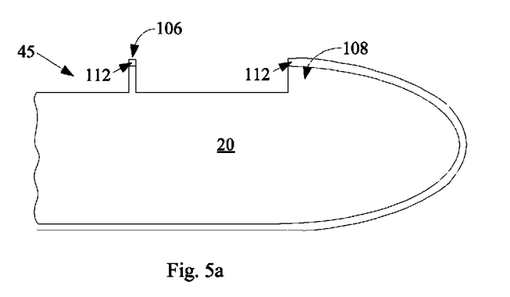
FIGS. 5a through 5e are cross-sectional views illustrating preparation of a surface of a donor body for reuse following cleaving, according to an embodiment of the present invention.

In the present invention, the column and edge asperities are removed and the surface treated, allowing it to be used for cleaving of additional laminae. FIG. 5a shows a donor wafer 20 from which a lamina has been cleaved, leaving behind a column asperity 106 and an edge asperity 108 at new surface 45. A stack 112 remains at the top of column asperity 106 and on edge asperity 108. First, turning to FIG. 5b, the stack 112 shown in FIG. 5a is removed by etching. This stack typically includes conductive layers, and may also include one or more dielectric layers. When only silicon remains, the column and edge asperities are removed by mechanical grinding. After the asperities have been removed, as little additional wafer thickness is removed as is practical, for example no more than one to five microns. Turning to FIG. 5c, the resulting surface is still somewhat irregular, with a peak-to-valley height of, for example, about 250 angstroms or less. FIG. 5c shows this irregularity greatly exaggerated for visibility. After cleaning, an oxide 47 is grown on surface 45, as shown in FIG. 5d, then the oxide is chemically stripped, as in FIG. 5e. The process of growing and removing oxide consumes silicon, removing grinding damage and any remaining exfoliation damage. The oxide growth and removal also tends to round the sharp points at surface 45; FIGS. 5f and 5g illustrate this effect, showing enlarged segments of surface 45 before and after oxide growth and removal, respectively. Rounding points creates very little difference in the actual peak-to-valley height of surface irregularity, but it has been found to provide unexpected improvement in bonding and exfoliation. Surface grinding, and growth and removal of oxide, are both relatively inexpensive processes.

It is advantageous to waste as little silicon as possible during treatment of the cleaved surface of the donor body. In the present invention, the surface of the donor body includes silicon asperities having relief of at least two microns, sometimes four, five or more microns. The surface is subjected to mechanical grinding to remove or reduce the asperities, then an oxide is grown and removed at the surface. After the etching step, ions are implanted through the surface to define a cleave plane within the donor body. Between the step of providing the donor body and the step of implanting ions, no more than about ten microns of thickness of silicon is removed from the donor body, including the relief of the asperities. In some embodiments, no more than about eight microns of thickness of silicon is removed from the donor body, including the relief of the asperities. No chemical-mechanical polishing is performed at the surface, and the grinding step does not include the use of a chemical etchant.

For clarity, a detailed example of treatment of an exfoliated surface of a donor wafer, and its reuse, will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 6A:
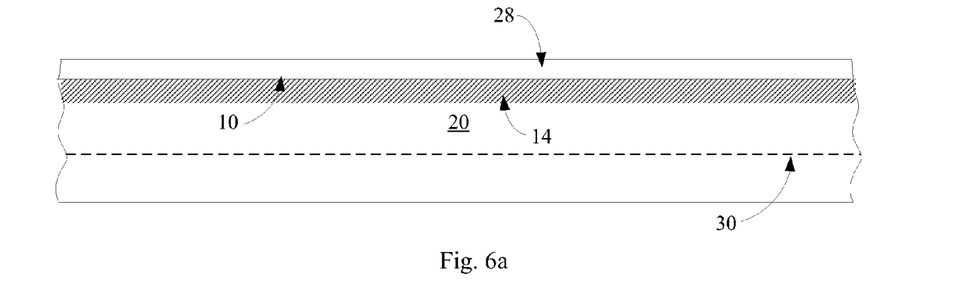
FIGS. 6a through 6c are cross-sectional views showing stages in fabrication of a photovoltaic cell formed from a lamina cleaved from a silicon donor body. The donor body may be prepared for reuse before and after cleaving of the lamina according to embodiments of the present invention.

Referring to FIG. 6a, donor wafer 20 is a monocrystalline silicon wafer which is lightly to moderately doped to a first conductivity type, for example an n-type wafer. Donor wafer 20 may be, for example, solar- or semiconductor-grade silicon.

First surface 10 of donor wafer 20 may be substantially planar, or may have some preexisting texture. If desired, some texturing or roughening of first surface 10 may be performed, for example by wet etch or plasma treatment. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 may be heavily doped to the same conductivity type as wafer 20, forming heavily doped region 14; in this example, heavily doped region 14 is n-type. This doping step can be performed by any conventional method, including diffusion doping. Doping and texturing can be performed in any order, but since most texturing methods remove some thickness of silicon, it may be preferred to form heavily doped n-type region 14 following texturing.

Next, in the present embodiment, a dielectric layer 28 is formed on first surface 10. If dielectric layer 28 is silicon dioxide, for example, it may be between about 1000 and about 1500 angstroms thick. This layer may be grown or deposited by any suitable method.

In the next step, ions, preferably hydrogen or a combination of hydrogen and helium, are implanted through dielectric layer 28 into wafer 20 to define cleave plane 30, as described earlier. The cost of this hydrogen or helium implant may reduced by methods described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009, both owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Figure 6B:
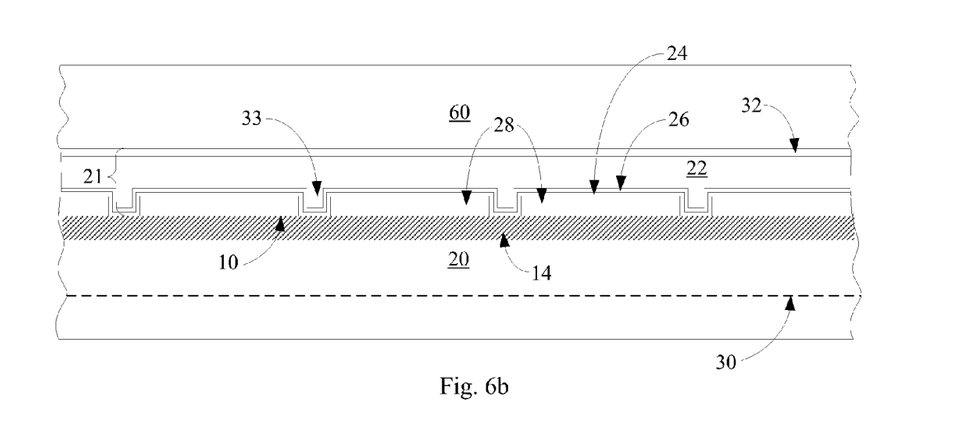

Turning to FIG. 6b, after implant, openings 33 are formed in dielectric layer 28 by any appropriate method, for example by laser scribing or screen printing. A titanium layer 24 is formed on dielectric layer 28 by any suitable method, for example by sputtering or thermal evaporation. This layer may have any desired thickness, for example about 100 angstroms.

Non-reactive barrier layer 26 is formed on and in immediate contact with titanium layer 24. Suitable materials for non-reactive barrier layer include TiW, TiN, W, Ta, TaN, TaSiN, or alloys thereof. The thickness of non-reactive barrier layer 26 may be about 1000 angstroms thick. Low-resistance layer 22 is formed on non-reactive barrier layer 26. This layer may be, for example, silver, cobalt, or tungsten or alloys thereof. In this example low-resistance layer 22 is silver. Silver layer 22 may be about 20,000 angstroms (2 microns) thick. In this example an adhesion layer 32 is formed on low-resistance layer 22. Adhesion layer 32 is a material that will adhere to receiver element 60, for example titanium. In some embodiments, adhesion layer 32 is about 400 angstroms.

Next, wafer 20 is affixed to a receiver element 60, with dielectric layer 28, titanium layer 24, non-reactive barrier layer 26, low-resistance layer 22, and adhesion layer 32 intervening. Receiver element 60 may be any suitable material, including glass, such as soda-lime glass or borosilicate glass; a metal or metal alloy such as stainless steel or aluminum; a polymer; or a semiconductor, such as metallurgical grade silicon. The wafer 20, receiver element 60, and intervening layers are bonded by any suitable method.

Figure 6C:
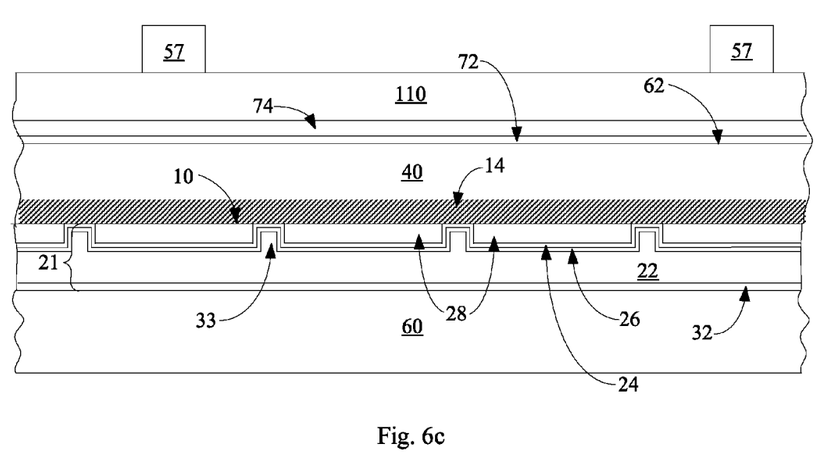

Referring to FIG. 6c, which shows the structure inverted with receiver element 60 on the bottom, a thermal step causes lamina 40 to cleave from donor wafer 20 at the cleave plane. In some embodiments, this cleaving step may be combined with a bonding step. Cleaving is achieved in this example by exfoliation, which may be achieved at temperatures between, for example, about 350 and about 650 degrees C. The thickness of lamina 40 is determined by the depth of cleave plane 30. In many embodiments, the thickness of lamina 40 is between about 1 and about 10 microns, for example between about 2 and about 5 microns, for example at least three microns. Following exfoliation, processing continues to fabricate a photovoltaic cell including lamina 40, as will be described.

As noted earlier, FIG. 5a shows new surface 45 of donor wafer 20, which was created by exfoliation. Note this surface cannot practically be drawn to scale. Surface 45 includes column asperities 106 and edge asperity 108. The relief of column asperities 106 and edge asperity 108 will typically be the thickness of the exfoliated lamina and the thickness of the grown and deposited stack 112 formed on the original surface of donor wafer 20 before bonding. In the example just described, deposited stack 112 includes (referring to FIG. 6b) dielectric layer 28, titanium layer 24, non-reactive barrier layer 26, silver layer 22, and adhesion layer 32. As will be appreciated by those skilled in the art, in other embodiments, the layers disposed between the lamina and the receiver element will vary, and thus the materials in deposited layers 112 at the top of column asperities 106 and edge asperity 108 immediately following exfoliation will vary as well.

Figure 5B:
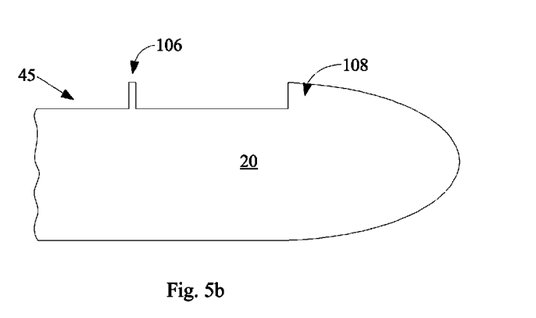
Figure 5C:
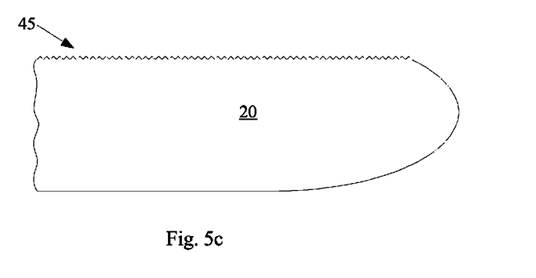
Figure 5D:
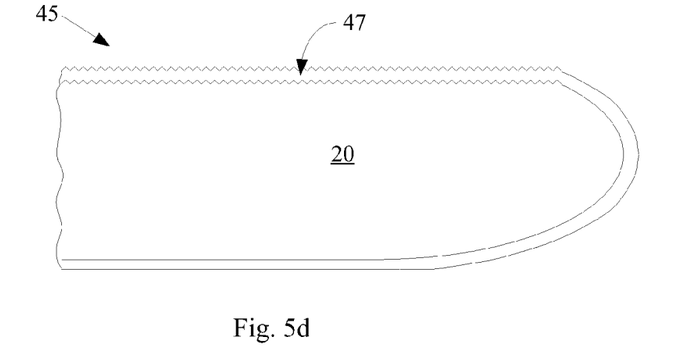

As shown in FIG. 5b, deposited layers 112 are removed, for example, by a simple wet etch. Etching may be performed with hydrofluoric acid, or a compound including hydrofluoric acid, until only silicon remains. Depending on the materials used for deposited layers 112, other etchants, or combination of etchants, may be used. Aqua regia or an electro-chemical etch may be employed. Little or no silicon is removed by this etching process.

Next, as shown in FIG. 5c, column asperities 106 and edge asperity 108 are removed by mechanical grinding. Grinding is done by any appropriate method. In one example, grinding may be done using an abrasive wheel with between 4000 and 6000 grit. The grinding process may be rotational, through-feed, or a combined process. For rotational grinding, typical grinding wheel speeds are between 1000 and 6500 rpm, while wafer rotational speeds range between 40 and 600 rpm. Either the grinding wheel, the wafer, or both may rotate. For through-feed grinding, the rotational speeds of the grinding wheel are similar to those used in rotational grinding. The linear travel speed of the grinding wheel and/or the wafer may be, for example, between 50 and 2000 mm/min. These different approaches achieve different surface finish. Diamond, silicon carbide, or any other suitable abrasive may be used.

During grinding, as little thickness as possible is removed beyond the height of column asperities 106 and edge asperity 108. In general, no more than about ten microns of thickness is removed from the donor body, including the relief of the column and edge asperities. For example, if the original thickness of the lamina was about 4.5 microns, then grinding will remove the height of the column asperities 106 and the edge asperity 108, which is also about 4.5 microns, and will remove no more than about an additional 5.5 microns. In other embodiments, substantially less thickness may be removed. For example, following removal of column asperities 106 and edge asperity 108, three microns, two microns, or only one additional micron or less of thickness may be removed.

The grinding step may itself leave contaminants at surface 45. A cleaning step is performed at surface 45 to remove these contaminants. This cleaning step may include an etch step. This cleaning etch removes minimal thickness, for example no more than 1000 angstroms, and generally far less. Referring to FIG. 5*d*, following cleaning, silicon dioxide layer 47 is grown at surface 45. Any suitable oxidation method may be used. In some embodiments, a wet oxide is performed at between 1000 and 1100 degrees C. Between about 0.5 and about 2 microns of silicon dioxide is grown, for example about 1 micron. Growing one micron of silicon dioxide consumes about 4000 angstroms of silicon. In alternative embodiments, silicon dioxide layer 47 could be replaced with a grown layer of some other suitable material, for example silicon oxynitride.

Figure 5E:
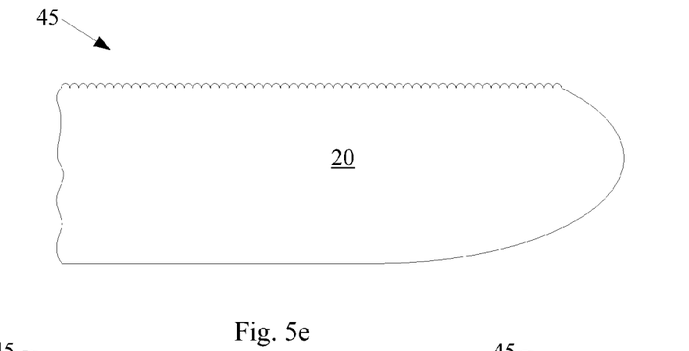
Figure 5F:
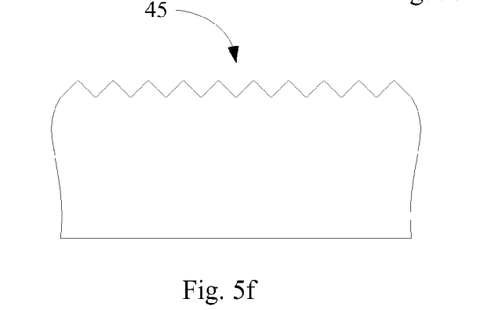
FIGS. 5f and 5g are cross-sectional views illustrating changes in the surface following growth and removal of oxide.
Figure 5G:
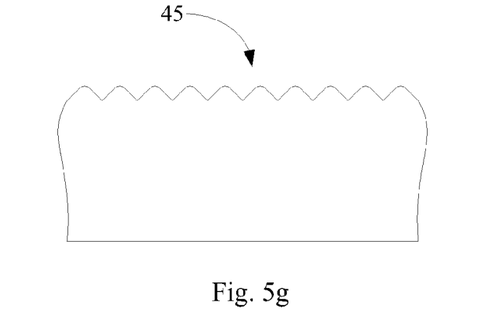

As shown in FIG. 5*e*, oxide layer 47 is then removed, for example by a hydrofluoric acid dip. FIG. 5*f* shows surface 45 immediately after grinding, and FIG. 5*g* shows the surface following oxide removal. As will be seen by comparing FIG. 5*f* and FIG. 5*g*, the process of growing and removing oxide layer 47 at surface 45 has very little effect on the peak-to-valley relief of surface 45, but tends to round the sharp peaks. Following treatment, the peak-to-valley relief of surface 45 will typically be about 250 angstroms or less, for example between about 50 and about 250 angstroms.

Following treatment, the donor wafer can be reused to form an additional lamina, for example in the fabrication steps described earlier and illustrated in FIGS. 6*a* through 6*c*. Turning to FIG. 6*c*, recall that dielectric layer 28, titanium layer 24, non-reactive barrier layer 26, silver layer 22, and adhesion layer 32 were formed on treated surface 45, and, following bonding to receiver element 60, lamina 40 was cleaved from the donor wafer.

Still referring to FIG. 6*c*, additional processing completes a photovoltaic cell comprising lamina 40. For example, intrinsic amorphous silicon layer 72 may be deposited on second surface 62, which was created by exfoliation, and heavily doped amorphous silicon layer 74 follows, serving as the emitter of the cell. A transparent conductive oxide layer 110 is formed next, and electrical contacts 57 complete the cell. Fabrication of this cell is described in detail in Herner, U.S. patent application Ser. No. 12/540,463, "Intermetal Stack For Use in a Photovoltaic Device," filed Aug. 13, 2009, owned by the assignee of the present application, and hereby incorporated by reference. It has been found that rounding the peaks of topography at the treated surface aids in bonding of the donor wafer to the receiver element and cleaving of the lamina from the donor wafer.

Figure 7:
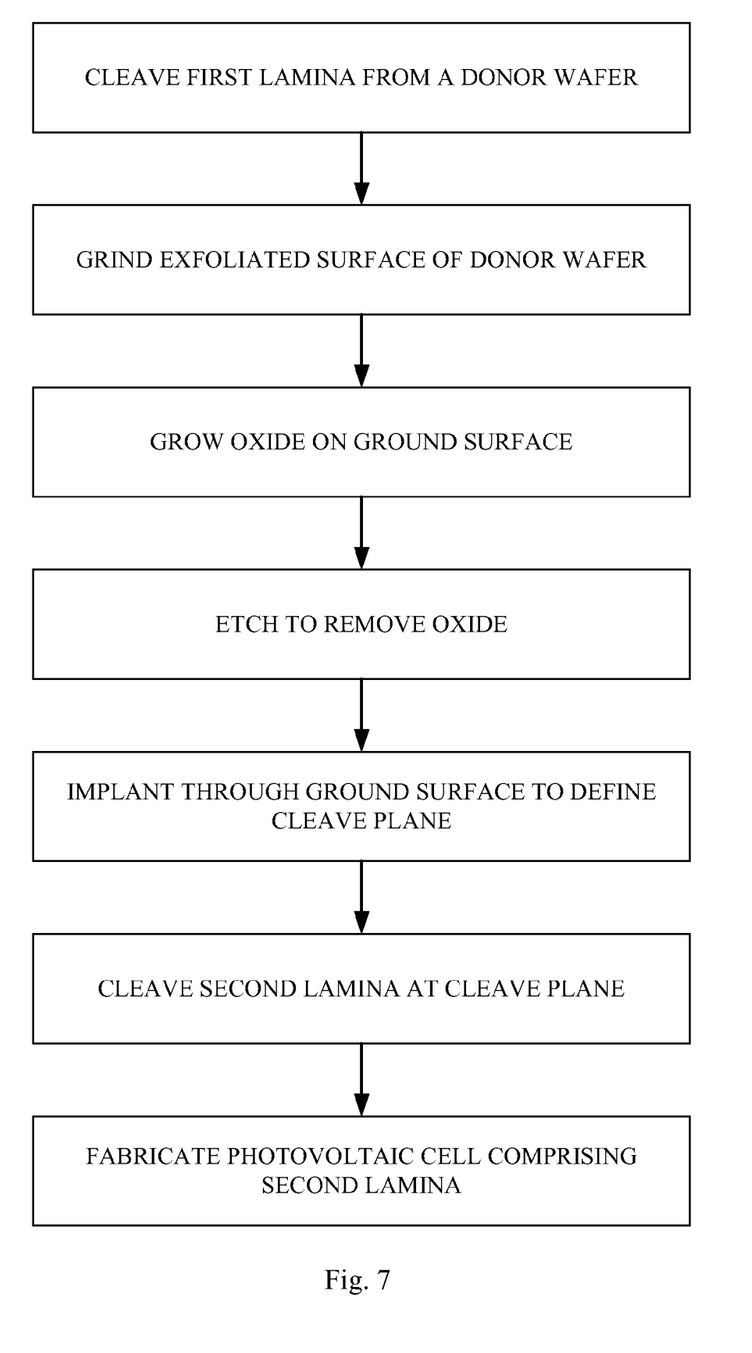
FIG. 7 is a flowchart illustrating an embodiment of the present invention.

As described, the methods of the present invention can be used to treat the surface of a donor wafer both after cleaving of a first lamina and before cleaving of a second lamina. Summarizing, what has been described is thermally cleaving a first lamina from the donor wafer, creating an exfoliated surface of the donor wafer; mechanically grinding the exfoliated surface to remove or reduce asperities; growing oxide on the exfoliated surface; etching to remove the oxide; implanting ions through the exfoliated surface to define a cleave plane within the donor wafer; thermally cleaving a second lamina from the donor wafer at the cleave plane, wherein the second lamina is suitable for use in a photovoltaic cell. A photovoltaic cell may be fabricated, for example using the methods of Sivaram et al., wherein the photovoltaic cell comprises the second lamina. FIG. 7 summarizes these process steps.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for treating a surface of a silicon donor body, the method comprising the steps of:
   introducing a metal layer to at least a portion of a donor wafer;
   thermally cleaving a first lamina from the donor wafer to create an exfoliated surface of the donor wafer, wherein the first lamina has a first surface and second surface opposite the first surface, and wherein a thickness of the lamina between the first and the second surface is between two and 10 microns and wherein the exfoliated surface of the donor body has silicon asperities having relief of at least the thickness of the lamina;
   mechanically grinding the surface to remove or reduce the asperities;
   before the grinding step, etching to remove at least a portion of the metal layer;
   after the grinding step, growing an oxide at the surface;
   etching to remove the oxide; and
   after the etching to remove the oxide step, implanting ions through the surface to define a cleave plane within the donor body,
   wherein between the step of thermally cleaving a first lamina and the step of implanting ions, between two and ten microns of thickness of silicon is removed from the donor body, including the relief of the asperities, and
   wherein, between the step of thermally cleaving a first lamina and the step of implanting ions, no chemical-mechanical polishing step is performed at the surface.

2. The method of claim 1 wherein, between the step of thermally cleaving a first lamina and the step of implanting ions, no more than about eight microns of thickness is removed from the donor body, including the relief of the asperities.

3. The method of claim 1 wherein the donor body is a silicon wafer.

4. The method of claim 3 wherein the donor body is a monocrystalline silicon wafer.

5. The method of claim 1 further comprising the step of cleaving a lamina from the donor body at the cleave plane.

6. The method of claim 1 wherein, immediately following the step of etching to remove the oxide, the surface has a peak-to-valley roughness between about 50 angstroms and about 250 angstroms.

7. The method of claim 1 wherein the step of etching to remove the oxide comprises etching with an etchant comprising hydrofluoric acid.

8. A method for treating a surface of a donor wafer, the method comprising the steps of:
   introducing a metal layer to at least a portion of the donor wafer;
   thermally cleaving a first lamina from the donor wafer, creating an exfoliated surface of the donor wafer wherein the first lamina has a first surface and second surface opposite the first surface, and the lamina has a thickness between the first and the second surface;

mechanically grinding the exfoliated surface to remove or reduce asperities, wherein the step of mechanically grinding the exfoliated surface does not include use of a chemical etchant;

wherein between the steps of thermally cleaving a first lamina and grinding the exfoliated surface, etching to remove at least a portion of the metal layer;

growing oxide on the exfoliated surface;

etching to remove the oxide, wherein after the steps of grinding, growing and etching to remove the oxide, a thickness of silicon is removed from the donor wafer, the thickness of silicon being at least the thickness between the first and second surface of the first lamina and up to 10 microns;

implanting ions through the exfoliated surface to define a cleave plane within the donor wafer, wherein between the step of thermally cleaving a first lamina and the step of implanting ions, no chemical-mechanical polishing step is performed at the surface; and thermally cleaving a second lamina from the donor wafer at the cleave plane, wherein the second lamina is suitable for use in a photovoltaic cell.

9. The method of claim 8 further comprising fabricating a photovoltaic cell, wherein the photovoltaic cell comprises the second lamina.

10. The method of claim 8 wherein the first lamina has a thickness of at least three microns.

11. The method of claim 8 wherein the donor wafer is a silicon wafer.

12. The method of claim 11 wherein the donor wafer is a monocrystalline silicon wafer.

13. The method of claim 8 wherein, following the step of etching to remove the oxide, the exfoliated surface has a peak-to-valley roughness between about 50 angstroms and about 250 angstroms.

14. The method of claim 8 wherein the ions include hydrogen ions.

* * * * *